(12) United States Patent
Hubel

(10) Patent No.: US 6,979,391 B1
(45) Date of Patent: *Dec. 27, 2005

(54) METHOD AND DEVICE FOR THE ELECTROLYTIC TREATMENT OF ELECTRICALLY CONDUCTING STRUCTURES WHICH ARE INSULATED FROM EACH OTHER AND POSITIONED ON THE SURFACE OF ELECTRICALLY INSULATING FILM MATERIALS AND USE OF THE METHOD

(75) Inventor: Egon Hubel, Feucht (DE)

(73) Assignee: Atotech Deutschland GmbH, Berlin (DE)

( * ) Notice: Subject to any disclaimer, the term of this patent is extended or adjusted under 35 U.S.C. 154(b) by 300 days.

This patent is subject to a terminal disclaimer.

(21) Appl. No.: 10/110,439

(22) PCT Filed: Oct. 5, 2000

(86) PCT No.: PCT/DE00/03568

§ 371 (c)(1),
(2), (4) Date: Apr. 11, 2002

(87) PCT Pub. No.: WO01/29289

PCT Pub. Date: Apr. 26, 2001

(30) Foreign Application Priority Data

Oct. 20, 1999 (DE) ................ 199 51 325

(51) Int. Cl.[7] ......... C25D 5/02; C25D 17/00; B23H 11/00; B01D 17/06
(52) U.S. Cl. ............ 205/129; 205/640; 205/687; 205/766; 205/771; 204/198; 204/252
(58) Field of Search ............ 205/118, 137, 138, 205/140, 300, 640, 129, 687, 766, 771; 204/198, 204/252

(56) References Cited

U.S. PATENT DOCUMENTS

| 3,779,877 A | | 12/1973 | Alwitt ............. 204/129.75 |
| 3,926,767 A | * | 12/1975 | Brendlinger et al. ...... 204/206 |
| 4,236,977 A | * | 12/1980 | Azzerri et al. .......... 205/140 |
| 4,272,351 A | | 6/1981 | Kotani et al. .......... 204/202 |
| 5,141,606 A | * | 8/1992 | Matsumoto et al. ...... 205/712 |
| 6,071,400 A | * | 6/2000 | Schroder et al. ........ 205/686 |
| 6,132,586 A | * | 10/2000 | Adams et al. .......... 205/123 |

(Continued)

FOREIGN PATENT DOCUMENTS

EP  0 093 681 B1  11/1985

(Continued)

OTHER PUBLICATIONS

PCT Publication WO/9737062, dated Oct. 9, 1997.

(Continued)

Primary Examiner—Edna Wong
(74) Attorney, Agent, or Firm—Paul & Paul

(57) ABSTRACT

For electrolytic treatment of electrically mutually insulated, electrically conductive structures 4 on surfaces of electrically insulating foil material (Fo), is unloaded from a store 15', 15", transported on a conveying line through a treatment unit 1 and brought in contact with treatment fluid F1. During transportation, the material Fo is guided past at least one electrode arrangement, having at least one cathodically polarised electrode 6 and at least one anodically polarised electrode 7, both being brought in contact with the treatment fluid F1 and being connected to a current/voltage source 8. Current flows through the electrodes 6, 7 and the electrically conductive structures 4. The electrodes 6, 7 are screened from each other so that substantially no electric current is able to flow directly between oppositely polarised electrodes 6, 7. The material Fo is finally loaded back onto a store 15', 15".

22 Claims, 8 Drawing Sheets

U.S. PATENT DOCUMENTS

2002/0150673 A1 * 10/2002 Thorn et al. .................. 427/58

FOREIGN PATENT DOCUMENTS

| EP | 0 395 542 A1 | 10/1990 | | |
|---|---|---|---|---|
| EP | 0 518 850 A1 | 6/1992 | | |
| EP | 0 838 542 A1 | 10/1997 | | |
| WO | WO 9965071 A1 * | 12/1999 | ......... | H01L 21/288 |

OTHER PUBLICATIONS

Patents Abstracts of Japan C-315. Dated Nov. 20, 1985.

* cited by examiner

METHOD AND DEVICE FOR THE ELECTROLYTIC TREATMENT OF ELECTRICALLY CONDUCTING STRUCTURES WHICH ARE INSULATED FROM EACH OTHER AND POSITIONED ON THE SURFACE OF ELECTRICALLY INSULATING FILM MATERIALS AND USE OF THE METHOD

BACKGROUND OF THE INVENTION

1. Field of the Invention

The invention relates to a method and device for electrolytic treatment of electrically mutually insulated, electrically conductive structures on surfaces of electrically insulating foil material and applications of the method.

2. Description of the Related Art

Electroplating processes among others are used for metal coating of strips. For quite a number of years, so-called reel-to-reel treatment units have been used for this purpose, the material being transported through said units and, during transportation, coming into contact with treatment fluid.

A method for electrolytic etching of aluminium foil is described in U.S. Pat. No. 3,779,877 in which the foil is firstly guided over anodically polarised contact shoes and then guided into the electroplating treatment baths. In the treatment baths, the foil is guided past cathodically polarised electrodes and then taken out of the bath again. The foil is thereby guided once again over anodically polarised contact shoes.

Another method for treating metal strips, metal wires or metal profiles is described in EP 0 518 850 A1 in which method the electrically conductive item to be treated is guided through two containers filled with aqueous electrolytes one after the other for electrolytic pickling, an anodic treatment in the second container following a cathodic treatment in the first container. Current from an electrode in the first container is directed thereby over the item to an electrode in the second container so that, by means of the item to be treated, a circuit is completed between the electrodes of a different polarity, said electrodes being located in the successive containers. In alternative embodiments, oppositely polarised electrodes can also be provided in one treatment container and further electrodes in additional containers.

Furthermore, a method is known from EP 0 093 681 B1 for continuous coating of wires, tubes and other semi-finished products made of aluminium with nickel. In this method, the semi-finished product is firstly conveyed into a first bath container and then into a second bath container. In the first bath container, the semi-finished product is guided past a negatively polarised electrode and, in the second bath container, guided past a positively polarised electrode. A metallising bath is situated in the bath containers. As a consequence of the fact that the semi-finished product is electrically conductive and, at the same time, is in contact with both metallising baths, the circuit between the electrodes, which are connected by a current source, is completed. In contrast to the negatively polarised electrode in the first bath container, the semi-finished product is anodically polarised. In contrast to the positively polarised electrode in the second bath container, the semi-finished product is on the other hand cathodically polarised so that metal can be deposited there.

A method is known from EP 0 395 542 A1 for continuous coating of a substrate, which is made of graphite, aluminium or its alloys, with a metal, the substrate being guided successively through two containers, which are connected to each other and contain an activation bath or a metallising bath, a cathode being disposed in the first container and an anode in the second container. Using this method, rods, tubes, wires, strips and other semi-finished products can be coated as substrates.

A fundamental disadvantage of the above-mentioned methods resides in the fact that only whole-surface conductive surfaces can be electrolytically treated but not electrically mutually insulated structures.

As a solution to the latter problem, a method has been proposed in WO 97/37062 A1 for electrochemical treatment of electrically mutually insulated regions on printed circuit boards. Accordingly, the printed circuit boards, which are brought in contact with the treatment solution, are brought in contact successively with stationary brush electrodes, which are supplied from a current source so that an electrical potential can be applied to the individual electrically conductive structures. An electrical potential is applied between the brushes, which are preferably formed of metal wires, and the anodes, which are disposed between the brushes.

This device has the disadvantage that the brushes are completely covered with metal within a very short time since approximately 90% of the metal is deposited on the brushes and only 10% on the regions to be metallised. Therefore, the brushes must be freed again of metal after just a short operational time. For this purpose, the brushes must be dismantled again from the device and be freed of metal or else elaborately constructed devices need to be provided which help to remove again the metal on the brushes by means of electrochemical polarity reversal of the brushes to be regenerated. In addition, the brush ends can easily damage fine structures on the printed circuit boards. Likewise, the brush material thereby wears quickly, the finest particles being rubbed off and getting into the bath where they lead to damage during metallisation. Especially for metallising very small structures, for example those with a width or length of 0.1 mm, there must be used brushes with very thin wires. These wear especially quickly. Particles which come from the worn brushes then proceed into the bath and into the holes of conductive foil and produce significant defects.

In other known methods for metallising electrically insulated structures, currentless metallising processes are used. However, these methods are slow, difficult to implement and expensive since fairly large quantities of chemical substances are used. The used substances are frequently environmentally damaging and therefore incur further significant costs in disposing thereof. In addition, it is not ensured that only the electrically conductive structures are metallised. It is often observed that, in this case, the metal is also deposited on the electrically insulating surface regions which lie between, resulting in rejection.

A method is described in EP 0 838 542 A1 for electrolytic pickling of metallic strips, especially high quality steel strips, strips made of titanium, aluminium or nickel, the electrical current being directed through the bath without electrically conducting contact between the strip and the electrodes. The electrodes are disposed opposite the strip and polarised cathodically or anodically. It has emerged though that, in the implementation of this method, the current yield in an electrolytic treatment is very small.

Finally, a device is disclosed in Patent Abstracts of Japan C-315, Nov. 20, 1985, Vol. 9, No. 293, JP 60-135600 A for electrolytic treatment of a steel strip. The strip is guided through an electrolytic bath for this purpose between oppositely polarised electrodes. In order to prevent an electrical current flow between the oppositely situated and oppositely polarised electrodes, shielding plates are provided between the electrodes in the plane in which the bath is guided.

The problem underlying the present invention is therefore to avoid the disadvantages of the known electrolytic treatment methods and in particular to find a device and method with which a continuous electrolytic treatment of small electrically mutually insulated, electrically conductive structures on surfaces of electrically insulating foil material is possible at low cost, it also requiring to be ensured that the equipment costs are low and that the method can be implemented with adequate efficiency. In particular, the method and the device should be able to be used for the production of conductive foils in printed circuit board technology.

BRIEF SUMMARY OF THE INVENTION

The method and the device according to the invention serve for electrolytic treatment of electrically mutually insulated, electrically conductive structures on surfaces of electrically insulating foil material, the electrically conducting structures not being directly in electrical contact. It is possible as a result to treat electrolytically structured regions which are electrically mutually insulated. Both externally situated regions on the foil material and hole walls in the material can be treated.

DETAILED DESCRIPTION OF THE INVENTION

In order to implement the method according to the invention, the foil material is unloaded from a store, for example a roller (for example unwound), then transported on a conveying line through a treatment unit and brought thereby in contact with treatment fluid. After passing through the unit, the foil material is finally loaded (for example wound) once again onto a store, for example a roller. One possibility consists in transporting the material in a horizontal conveying direction. The conveying line shown in the drawings as flat and horizontal could, if desired, be vertical. Such an arrangement is implemented in so-called reel-to-reel units. For this purpose, the material is transported by known means, for example by rollers or cylinders. Alternatively, the foil material can also be guided in the unit via deflecting rollers and as a result can change the direction in the unit one or more times. As a result, the longest possible route in the unit is attained so that the treatment time is extended for a preset feed rate of the material.

The device according to the invention has the following features:

a) at least a first and second device respectively for storing the foil material, for example one roller, on which the material is stored and unwound for treatment, and one roller, on which the material is wound again after treatment;

b) suitable transport devices, for example rollers, cylinders or other retaining elements, such as clamps for transporting the foil material on a conveying line through a treatment unit from at least the one first storing device to at least the one second storing device;

c) at least one device for bringing the foil material in contact with a treatment fluid, for example a treatment container into which the material can be introduced, or suitable nozzles, with which the liquid is supplied to the material surfaces;

d) at least one electrode arrangement, comprising respectively at least one cathodically polarised electrode and at least one anodically polarised electrode, at least the one cathodically polarised electrode and at least the one anodically polarised electrode being able to be brought in contact with the treatment fluid; the electrodes can be either disposed for one-sided treatment of the material on only one side of the conveying line or, for two-sided treatment, also on both sides; the cathodically polarised electrodes and the anodically polarised electrodes of an electrode arrangement are orientated on one side of the conveying line;

e) at least one insulation wall between the electrodes of one electrode arrangement respectively;

f) at least one current/voltage source which is connected to the electrode arrangements in order to produce a current flow through the electrodes of the electrode arrangements, a galvano-rectifier or a comparable current/voltage source or a current/voltage source for producing unipolar or bipolar current pulses being able to be used as the current/voltage source;

g) at least the one cathodically polarised electrode and at least the one anodically polarised electrode being mutually screened by at least the one insulation wall in such a manner that substantially no electrical current can flow directly between the oppositely polarised electrodes.

In order to implement the method according to the invention, the foil material is brought in contact with the treatment fluid while being transported through the treatment unit and guided past at least one electrode arrangement, which comprises respectively at least one cathodically polarised electrode and at least one anodically polarised electrode. The cathodically and anodically polarised electrodes are also brought in contact with the treatment fluid and connected to a current/voltage source so that, on the one hand, a current flows between the cathodically polarised electrode and an electrically conductive structure on the material and, on the other hand, a current flows between the anodically polarised electrode and the same electrically conductive structure on the material if this structure is situated opposite both electrodes at the same time.

If a two-sided treatment of the material is desired, electrodes must be disposed on both sides of the material. In the case of one-sided treatment, it is adequate to have electrodes on one side of the material. The electrodes of a electrode arrangement, which comprises respectively at least one anodic and at least one cathodic electrode, are disposed in such a manner that they are orientated on one side of the material and that at least one insulation wall is disposed between the electrodes.

The electrodes are electrically connected by for example a galvano-rectifier. If a plurality of electrode arrangements is used then all of the electrode arrangements can be connected to the same galvano-rectifier. In certain conditions, it can also be advantageous however to connect the individual electrode arrangements respectively to one galvano-rectifier. The galvano-rectifiers can be operated as current source or as voltage source.

As a consequence of the fact that an electrically conductive connection exists by means of a conductive layer to be processed on the structures of the material, which structures are situated opposite the cathodically polarised electrode or the anodically polarised electrode at the same time, these structures are polarised respectively anodically or cathodically relative to the electrodes. As a result, electrochemical processes are set in motion at these places. An electrical contact of the material is not required to produce a current flow in the material. The material operates as an intermediate conductor. An electrode and the structure situated opposite this electrode on the material can be regarded as an electrolytic partial cell. One of the two electrodes of this partial cell is formed by the material itself and the other by the electrode of the electrode arrangement. As a result of the fact that the material is situated opposite a cathodically and an anodically polarised electrode, a serial connection of two electrolytic partial cells of this type is effected, said partial cells being supplied from a current/voltage source, for example from a galvano-rectifier.

The advantage of the method and the device according to the invention compared to known methods and devices resides in the fact that the equipment costs for producing a current flow in the material to be treated is a great deal less than in many known methods and devices. In the present case, no contacting elements need to be provided. The material is polarised without contact. As a result, the deposition of metal, especially with a small layer thickness, can be implemented very economically. Furthermore, the arrangement can be configured very simply.

The method and the device according to the invention therefore make possible the electrolytic treatment of electrically mutually insulated, electrically conductive metal islands (structures) at low cost.

Relative to the methods proposed for printed circuit board technology for metallising mutually insulated metal islands with brush arrangements, the method and device according to the invention have the advantage that only small quantities of metal are deposited needlessly on the cathodically polarised electrode. The frequency with which the metal must be removed from the cathodically polarised electrodes again, is in the region of a few days to a few weeks. In addition, there is no problem of the brush electrodes becoming worn during contact with the surfaces to be metallised and hence of abraded particles contaminating the treatment bath.

Since the electrodes of an electrode arrangement, which are polarised oppositely to each other, are mutually screened in such a manner that substantially no electrical current can flow directly between these electrodes, the efficiency of the method relative to known methods and devices is increased by a multiple since the current yield is very much greater. Only when, according to the invention, an insulation wall is provided between the oppositely polarised electrodes in the electrode arrangements, can the net effect be achieved also on the electrically insulated structures in that the spacing between the electrodes is adjusted according to the size of the structures to be treated, while an adequate effect level of the method is maintained. In the case of small structures, a small spacing is required; in the case of larger structures, the spacing can also be larger. By means of the insulation wall, a direct current flow is prevented thereby between the oppositely polarised electrodes (short-circuit current) and likewise a direct current flow from the one electrode to the region on the substrate to be treated which is situated opposite the other electrode and vice versa.

The option is also advantageous that very high currents can be transferred without difficulty to the material to be treated without the electrically conductive surface structures on the material being heated and damaged or even destroyed since no contact means are required. Because of the effective cooling of the material to be coated by the surrounding treatment fluid, the specific current loading in the metal layer to be treated can be set very high, for example up to 100 A/mm$^2$.

The method and the device can be used for implementing any electrolytic processes: electroplating, etching, oxidising, reduction, cleaning, electrolytic assistance in non-electrolytic per se processes, for example for starting a currentless metallising process. For example, gases can also be produced on the surfaces of the material, namely hydrogen in a cathodic reaction and/or oxygen in an anodic reaction. It is also possible for these individual processes to take place at the same time, together with other methods, for example metallising processes or other electrochemical processes.

Areas of application of the method or the device according to the invention are among others:
  deposition of thin metal layers;
  transference of surface layers made of metal within a plate or foil from one sacrificial region to another region, for example in order to reinforce surface layers with the metal which is obtained from the sacrificial region;
  thinning by etching, for example the removal of a layer of several $\mu$m from the surfaces of the material;
  pulse etching;
  deposition of metal with pulse current;
  electrolytic oxidation and reduction of metallic surfaces;
  electrolytic cleaning by anodic or cathodic reaction (for example, by electrolytic formation of hydrogen or oxygen);
  electrolytic deburring of perforated foils provided with structures;
  etch-cleaning with electrolytic assistance; and further processes in which electrolytic assistance is advantageous.

The method and the device can be used particularly well for depositing thin metal layers, for example layers up to a thickness of 5 $\mu$m.

The following conditions among others can be set for implementing the method according to the invention:
  the type of material from which the basic conductive layer of the material to be treated is formed;
  the type of coating metal;
  the type and the parameters of the electrolytic process, for example the current density;
  the composition of the treatment fluid;
  the geometry of the treatment device, for example the width of the electrode spaces in the conveying direction.

By optimal selection of combinations of the above-mentioned parameters, the electrolytic treatment can be controlled. For example, by choosing a specific metal depositing bath it can be effected that the already deposited metal is not etched off again since the metal dissolution process is restricted in this case. At the same time, it can be achieved by appropriate choice of an etching bath that the metal deposition in this bath is restricted.

In order to implement the method for etching metal surfaces on the material, the material is guided firstly past at least one anodically polarised and then at least one cathodically polarised electrode.

The method and the device can be used for metallising. For this purpose, the material is guided firstly past at least one cathodically polarised and then at least one anodically polarised electrode. Preferably, material with structures is used for electrolytic metallising, which structures are provided with a surface which is insoluble during electrolytic metallising. For example, final layers made of metal can be formed on conductive foils, for example a tin coating on copper with the method and the device according to the invention.

A further application of the method and the device consists in deburring the conductive foil material after boring by means of electrolytic etching. To date, devices have been used to deburr printed circuit boards which are based on mechanical methods, for example, rotary brushes with which the burr is removed. Mechanical methods of this type are entirely unusable for foil materials since the foil materials would be destroyed by mechanical treatment.

The principle of the method and device according to the invention is explained subsequently with reference to

BRIEF DESCRIPTION OF DRAWING FIGS. 1 AND 2

FIG. 1 schematic illustration of the device according to the invention; and

FIG. 2 schematic illustration of the principle of the method according to the invention.

FURTHER DETAILED DESCRIPTION OF THE INVENTION

A bath container 2 in a treatment unit 1 is illustrated in FIG. 1 and is filled up to the level Ni with a suitable treatment fluid F1. Electrically insulating foil material Fo with electrically mutually insulated, electrically conductive structures 4 is guided through the treatment fluid F1 in a horizontal direction Ri' or Ri" by means of suitable conveying means 3, such as for example rollers or cylinders. In addition, there are two electrodes 6, 7 in the bath container 2 which are connected to a current/voltage source 8. The electrode 6 is cathodically polarised, the electrode 7 anodically polarised. An insulation wall 9 (for example of plastic material) is disposed between the two electrodes 6, 7 and screens the two electrodes from each other electrically, transversely relative to the conveying direction. This wall 9 is preferably introduced so tightly against the film Fo that said wall contacts or at least reaches up to said foil when passing by.

While the foil Fo is being moved past the electrodes 6, 7, the structures 4* are polarised, and indeed anodically in the regions $4^*_a$, which are situated opposite the cathodically polarised electrode 6, and cathodically in the regions $4^*_k$, which are situated opposite the anodic electrode 7.

If the foil Fo is guided past the electrodes 6, 7 for example in the direction Ri', then the structures 4 are etched. In this case, the left region $4^*_a$ of the structure 4* is anodically polarised in the position shown in FIG. 1 so that metal is etched away from the conductive track structure. The right region $4^*_k$ of this structure 4* is, on the other hand, orientated towards the anodically polarised electrode 7 and hence is negatively polarised. If the treatment fluid F1 contains no further electrochemically active redox pairs, hydrogen is generated in this region $4^*_k$. In summary, metal is therefore removed from the structures 4. This procedure continues in the case of a single structure 4 for as long as this structure is situated simultaneously in the effective regions of both oppositely polarised electrodes 6 and 7.

If the foil Fo is to be metallised, it must be transported in the direction Ri". In this case, a metallising bath is used as treatment fluid F1. Firstly, the respectively right edges of the structures 4 enter into the region of the cathodically polarised electrode 6 and then into the region of the anodically polarised electrode 7. The right part $4^*_k$ of the structure 4* is situated opposite the anodically polarised electrode 7 in the position shown in FIG. 1 and thus is polarised cathodically. On the other hand, the left part $4^*_a$ of the structure 4* is situated opposite the cathodically polarised electrode 6 so that this part is polarised anodically. If for example a conductive track structure, which is made of copper as the basic conductive layer, is to be treated with tin from a tinning bath F1 which contains tin ions, then only oxygen is generated on the left part $4^*_a$ of the structure 4*. On the other hand, tin is deposited on the right part $4^*_k$. To sum up, tin is thus deposited on the copper structures.

Basically the same arrangement as described in FIG. 1 is shown in FIG. 2, provided with a bath container 2 with electrolytic fluid F1. The level of fluid F1 is designated by Ni. In addition to FIG. 1, the effect of the electrical field of the electrodes 6, 7 on the foil Fo is reproduced schematically. An insulation wall 9 is located between the electrodes 6 and 7. The regions $4^*_a$ and $4^*_k$ of the metallic structures are connected together electrically. A more positive potential is produced at the region $4^*_a$, which is situated opposite the cathodically polarised electrode 6 so that this region is polarised anodically. A more negative potential is produced at the region $4^*_k$ by the oppositely situated anodically polarised electrode 7, so that this region is polarised cathodically. In the illustrated arrangement the structure $4^*_k$ is metallised when the electrolytic fluid F1 is a metallising bath. At the same time, an anodic process takes place at the anodically polarised structure $4^*_a$. If the electrolytic fluid F1 is a tin bath and the structures 4 are made of copper, copper is not dissolved. Instead of this, oxygen is generated at the region $4^*_a$.

During the electrolytic process, both soluble and insoluble electrodes can be used as electrodes. Soluble electrodes are normally used in the metallising method so as to reform again by dissolution the metal used in metallisation in the metallising solution. Thus, electrodes made of metal, which is to be deposited, are used. Insoluble electrodes are also inert in the treatment fluid during the current flow. For example, lead electrodes, platinised titanium electrodes, titanium or noble metal electrodes coated with iridium oxide can be used.

If the method and the device are used for electrolytic metallising, then a metallising bath containing metal ions is used. When using soluble, anodically polarised electrodes, the metal ions are supplied by dissolution of these electrodes. On the other hand, if insoluble electrodes are used, then the metal ions must be supplemented either by separate addition of suitable chemicals or for example the device described in WO 9518251 A1 is used in which metal parts are dissolved by additional ions of a redox pair, which ions are contained in a metallising bath. In this case, an $Fe^{2+}/Fe^{3+}$ or another redox pair is contained in the copper baths.

In a further variant of the method and device, the electrodes can be disposed in an electrode arrangement in such a way that they are orientated on only one side of the material. In order to avoid a direct current flow in this case between the two electrodes, it is advantageous to dispose at least one insulation wall (for instance made of a polyimide film which is 50 $\mu$m thick) between the electrodes and to move said wall very near to the material. The insulation walls are preferably disposed in such a way that they contact the material when being transported through the electrolytic bath or that they reach at least directly up to the surfaces of the material. As a result, an especially good screening of the anodic electrode from the cathodic electrode is achieved.

Since small structures to be metallised must be situated opposite both at least one cathodic and at least one anodic electrode for electrolytic treatment, the spacing between the electrodes, given an established size of the structures, must not exceed a specific value. Consequently, a top limit is also established for the thickness of the insulation wall. As a rule of thumb, it can be assumed that the thickness of the insulation wall should correspond at most to approximately half of the extension of the structures to be metallised, preferably comparing the dimensions respectively in the conveying direction of the material. In the case of structures with a width of approximately 100 µm, the thickness of the insulation wall should not exceed 50 µm. In the case of narrower structures, correspondingly thin insulation walls should be used. Further insulation walls can be provided in addition between the individual electrode arrangements in order to avoid a direct current flow between the electrodes of further electrode arrangements which are disposed one behind the other.

If the material is not plunged into the treatment fluid but brought in contact with the fluid by means of suitable nozzles, the isolation walls can be totally dispensed with if the fluid regions which are in contact with the individual electrodes do not come in contact with each other.

In an alternative method and device variant, the electrodes of an electrode arrangement can also be disposed in such a way that they are orientated on different sides of the material. In this case, the material itself functions as an insulation wall between the electrodes so that the use of insulation walls between the electrodes of an electrode arrangement can be dispensed with when the electrodes do not protrude beyond the material. This method and device variant can be applied when the electrically conductive regions on both sides of the material are connected to each other electrically. This arrangement is suitable for example for the treatment of through hole plated conductive foils which are functional on one side. As a result of the fact that for example material with a whole-surface electrically conductive layer is used on the side situated opposite the functional side, the cathodically polarised electrode can be disposed opposite this conductive layer and the anodically polarised electrode opposite the functional side in order to deposit metal on the conductive structures of the functional side. At the same time, metal is removed from the oppositely situated conductive layer.

An electrode arrangement can extend perpendicularly or diagonally to the direction in which the material is transported in the treatment unit, preferably over the entire treatment width of the plane in which the conveying line for the material extends. The spatial extension of the electrode arrangements, observed in conveying direction, has a significant effect on the duration of the electrolytic treatment. Long electrode arrangements can be used for large structures on the material. On the other hand, very short electrode arrangements must be used when treating very fine structures.

This can be explained in more detail with reference to FIG. 1. If the material Fo is moved from left to right (conveying direction Ri''; case: electroplating), the lading right edge of a structure 4* is electroplated longer than the rear regions of the structure. As a result, an irregular layer thickness is obtained. The maximum thickness of the layer depends substantially upon the length of the electrode arrangement in the conveying direction Ri', Ri'' and, furthermore, upon the conveying rate, the current density and the dimensions of the structures 4 in conveying direction Ri', Ri''. Long electrode arrangements and, at the same time, long structures 4 in conveying direction Ri', Ri'' result, measured absolutely, in large differences in layer thickness in the case of a large initial layer thickness. When the electrode arrangements have a smaller length in conveying direction Ri', Ri'', the differences in layer thickness become smaller. At the same time, the treatment time is reduced. The dimensions of the electrode arrangements can therefore be adapted to requirement. In the case of the finest conductive track structures, for example 0.1 mm pads or conductive tracks of 50 µm width, the length of the electrode arrangements should be in the sub-millimeter region.

In order to multiply the effect of the method, at least two electrode arrangements can be provided in one treatment unit and the material can be guided past said electrode arrangements successively. The electrodes of these electrode arrangements can have an extended configuration and be disposed substantially parallel to the conveying plane. The electrodes can be orientated either substantially perpendicular to the conveying direction or form an angle $\alpha \neq 90°$ to the conveying direction. Said electrodes extend preferably over the entire width of the conveying plane covered by the material.

With an arrangement in which the electrodes form an angle $\alpha \neq 90°$ to the conveying direction, it is achieved that electrically insulated metal structures, which are orientated both parallel to the conveying direction and perpendicular thereto are subjected longer to the desired electrolytic reaction than when $\alpha \approx 90°$ ($\pm 25°$). If the angle were $\alpha \approx 90°$, then the conductive tracks, orientated in the conveying direction and at a given conveying rate and given electrode length, would be electrolytically treated for an adequate length of time, while conductive tracks orientated perpendicular thereto would only be treated in the electrode arrangement for a short period of time. This is due to the fact that electrolytic treatment is only possible if the structure is situated at the same time opposite the anodically polarised and the cathodically polarised electrode of an electrode arrangement. In the case of structures, which are orientated parallel to the electrode arrangement and hence to the electrodes, this contact time is short. The reverse applies when the electrode arrangements are orientated parallel to the conveying direction ($\alpha \approx 0°$ ($\pm 25°$))

The device according to the invention can also have a plurality of electrode arrangements with electrodes in an extended configuration, the electrodes of the different electrode arrangements forming different angles to the conveying direction. In particular, an arrangement of at least two extended electrode arrangements is advantageous, the angle between the electrode arrangements and the conveying direction of the material in the treatment unit being $\alpha \neq 90°$ and the electrode arrangements being disposed approximately perpendicularly to each other. Preferably, $\alpha_1 \approx 45°$ (first electrode arrangement), especially 20° to 70°, and $\alpha_2 \approx 135°$ (second electrode arrangement), especially 110° to 160°.

In an especially preferred method, the electrodes are moved in an oscillating manner substantially parallel to the conveying plane.

Furthermore, there can also be provided a plurality of electrode arrangements, which are disposed parallel to each other and adjacent and have electrodes in an extended configuration and insulation walls disposed respectively between said electrodes, and adjacent electrodes can be supplied respectively from a separate current/voltage source. In this case when for example a metallising solution is used, metal is firstly deposited on the insulated structures of the material. Since the regions of the structures which are at the front during transportation are situated for longer in the metallising region than the rear structures, the thickness of the metal layer on the former is greater. If the material then passes the second electrode arrangement, which comprises the second electrode in the first arrangement or a third electrode and a further oppositely polarised electrode in the second arrangement, then a lot of metal is removed again from the front regions of the material and, on the rear structures, more metal is deposited than removed. Hence to sum up, an averaging of the thickness of the metal layer on the structures is effected during treatment in the two electrode arrangements.

In order to achieve an especially uniform metal layer thickness with this arrangement, the current density on the structures situated opposite the first electrode arrangement can be adjusted to a value which is approximately twice as great as the current density on the structures situated opposite the second electrode arrangement.

In a further preferred method, the electrode arrangements can in addition be surrounded by insulation walls. If a plurality of adjacent electrode arrangements is used, these insulation walls are disposed between the electrode arrangements. Openings, which are orientated towards the conveying plane, are formed through these insulation walls, which surround the electrode arrangements, and through the insulation walls, which are disposed between the electrodes.

These openings can have widths of various sizes in accordance with the existing requirements. For example, these openings have, regarded in the conveying direction, such a width respectively that the openings associated with the cathodically polarised electrodes are smaller than the openings associated with the anodically polarised electrodes when the method for depositing metal on the material is used, or that the openings associated with the cathodically polarised electrodes are greater than the openings associated with the anodically polarised electrodes when the method for etching metal surfaces on the material is applied.

It is achieved with this embodiment that the current density at the regions, situated opposite the cathodically polarised electrodes, on the material pieces to be treated is different from the current density at the regions which are situated opposite the anodically polarised electrodes. Due to these differences, potentials of different magnitude can be set at these regions to favor specific electrolytic processes and to repress others. Hence, it is possible for example to speed up the deposition of metal relative to the competing dissolution of the metal in order also to deposit metals at a greater thickness on the material in this manner. While, in the above-mentioned case, the current density and hence the potential at the region on the material, which is situated opposite the cathodically polarised electrode, is increased, there occurs there as a competing reaction, the decomposition of water (generation of oxygen). As a result, less metal is dissolved than is deposited at the material surfaces which correspond to the anodically polarised electrodes. The reverse is of course true for an application in which metal is etched.

In order to prevent metal deposition on the cathodically polarised electrodes, these can be screened with ion-sensitive membranes so that electrolytic spaces are formed which surround the cathodically polarised electrodes. If ion-sensitive membranes are not used, deposited metal on the cathodically polarised electrodes must be removed again on a daily or weekly basis. For this purpose, for example a cathodically polarised surface electrode can be disposed for stripping these electrodes, the metallised electrodes being anodically polarised in this case. These stripping electrodes can be introduced into the electrode arrangement during production breaks instead of the material to be treated. A cyclical exchange is also very simple with external stripping of the cathodically polarised electrodes.

Furthermore, it can be advantageous for treating the material to modulate the electrical voltage applied to the electrodes of the electrode arrangements in such a way that a unipolar or bipolar current pulse sequence flows to the electrodes.

The subsequent Figures serve to further explain the invention and show in detail:

FURTHER DETAILED DESCRIPTION OF THE INVENTION

Figure 1:
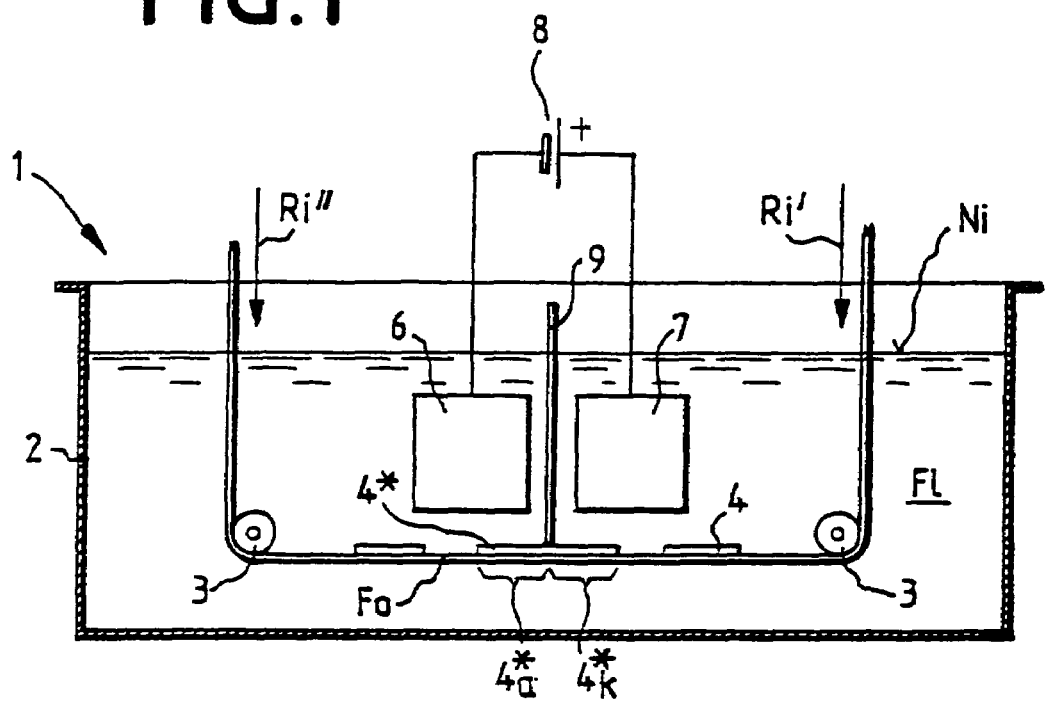
Figure 2:
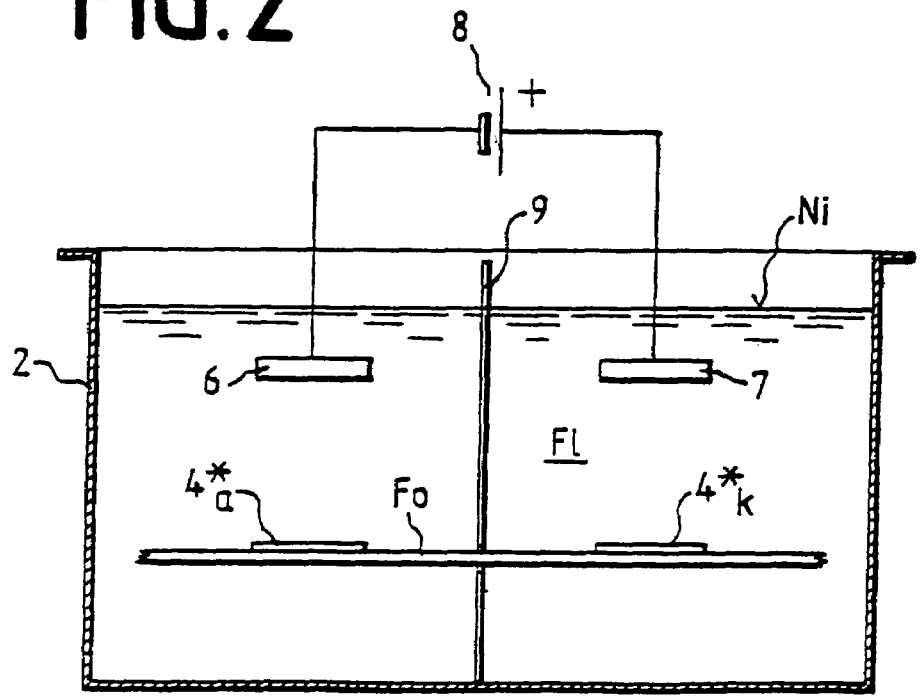

An electrode arrangement according to FIGS. 1 and 2 is eminently suitable for treating large metal structures. The length of the electrodes in conveying direction determines, together with the conveying rate, the duration of the electrolytic treatment with an electrode arrangement. In the case of large structures to be treated, a large electrode length in conveying direction is chosen, at least if this concerns the process-determining electrode.

If care is taken by means of appropriate process parameters that the treatment effect achieved firstly at the first electrode is not reversed again or at least not entirely by treatment at the second electrode of an electrode arrangement, then a plurality of electrode arrangements according to the invention can be disposed successively in conveying direction, i.e. a foil is guided past a plurality of electrode arrangements successively. The respective treatment results, which are achieved with the individual electrode arrangements, accumulate. The length of the electrode arrangements in conveying direction must be adapted to the size of the structures to be treated. When treating small structures, this length must also be selected to be small. The number of electrode arrangements must be chosen to be correspondingly greater when a treatment outcome is required. It is always a prerequisite that the treatment outcome is not reversed again by the respectively subsequent electrode of an electrode arrangement. For example, an already deposited metal layer should not be removed again when passing a subsequent cathodically polarised electrode.

In the case of very small structures to be treated, the treatment of the edge regions of structures to be treated, which are guided past the electrodes firstly or lastly, comes to the fore. However, these edge regions should also be electrolytically treated in as uniform a manner as possible.

Figure 3:
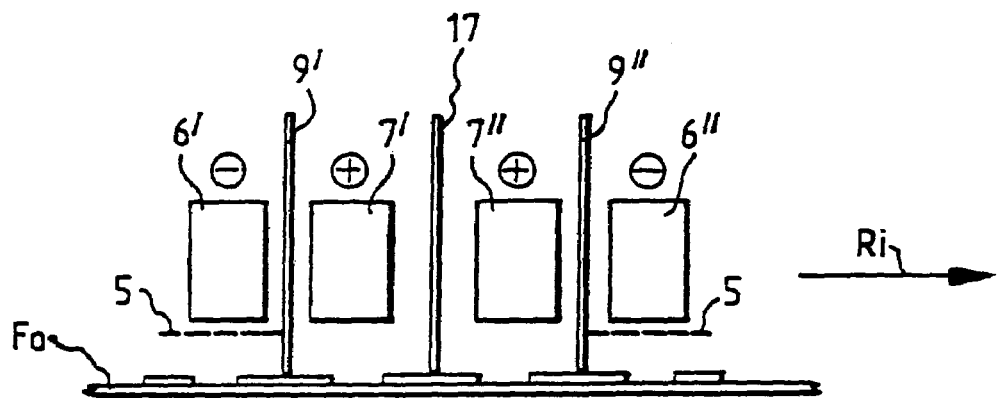
FIG. 3: a schematic illustration of the construction of an electrode arrangement.

For this purpose, the possibility of being able to set electrochemically "oppositely directed" reactions (for example metallising, stripping) in the electrode arrangement in a targeted manner is used advantageously. With reference to FIG. 3, the very uniform electrolytic treatment of even the smallest structures (width 0.1 mm) is described.

In FIG. 3, an arrangement with two electrode arrangements is reproduced which have respectively anodically and cathodically polarised electrodes 6', 7', 6", 7". A foil Fo with the structures 4, for example conductive track structures made of copper, is guided in conveying direction Ri through a not-shown electrolytic fluid. A tin bath is used in this example as electrolytic fluid.

The cathodically polarised electrodes 6', 6" are screened by ion-sensitive diaphragms 5 from the surrounding electrolytic space. As a result, the deposition of tin on the electrodes 6', 6" from the electrolytic fluid is prevented. Insulation walls 9' or 9" are located respectively between the electrodes 6' and 7' or 6" and 7". An insulation wall 17 is disposed between the two electrode arrangements. The diaphragms 5 can also be dispensed with. In this case, the cathodically polarised electrodes 6', 6" need to be stripped from time to time.

The structures 4 are metallised in the first electrode arrangement in which the electrodes 6' and 7' are located. As a result of the fact that the structures 4 are guided past the electrode arrangement from left to right, the right edge of the structures 4 is subjected for a longer time to the electrolytic reaction than the left edge so that the deposited quantity of metal and hence the thickness of the metal layer is greater than on the left edge. In order to compensate at least in part for this lack of balance, the foil Fo is guided past the second electrode arrangement after passing through the first electrode arrangement. In this arrangement, the sequence of the cathodically polarised electrode 6" and of the anodically polarised electrode 7" is changed relative to the polarity of the electrodes 6' and 7' in the first electrode arrangement so that the left edge of the structures 4 respectively is subjected for a longer time to the electrochemical (electroplating) effect of the electrode 7" than the respective right edge. The right edge of the structures 4 is anodically polarised when passing the cathodically polarised electrode 6" and hence is subjected for a longer time to the anodic reaction than the left edge of the structures 4 so that, in this case, metal is preferably removed again on the right edge. As a result, a substantially uniformly thin layer of tin is deposited.

Figure 4:
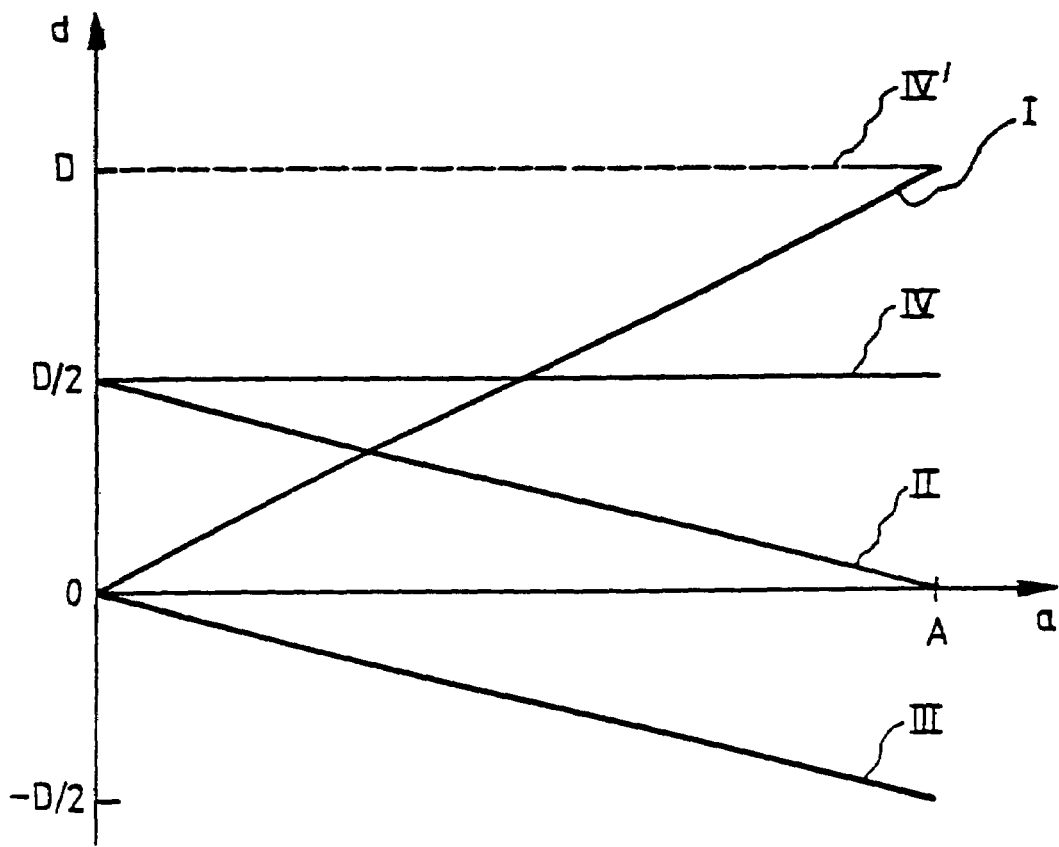
FIG. 4: the layer thickness configuration of a structure after treatment in the device according to FIG. 3.

This result can be understood with the help of the diagram in FIG. 4 in which the obtained metal layer thickness d is reproduced as a function of the length extension a of the structure 4 to be coated. This diagram was drawn up with the condition that the current in the second electrode arrangement is half as great as in the first electrode arrangement and that the current yield of the electrochemical reactions (metal dissolution, metal deposition) is close to 100%.

The layer thickness distribution, which can be measured after the structures have passed through the first electrode arrangement, is designated by the curve I. On the left edge of the structures (a=0), practically no metal has been deposited, while on the right edge (a=A) the layer thickness D is achieved. Two processes take place when passing the second electrode arrangement: at the left edge, in practice only metal is deposited (partial process, displayed by curve II). Thus, the layer thickness D/2 is achieved in this region. In addition, in practice only metal is removed at the right edge (partial process, displayed by curve III). Thus, the layer thickness at this location is reduced from originally d=D to d=D/2. The intermediate regions on the structure likewise have substantially a layer thickness of d = D/2. The resulting layer thickness distribution is indicated in curve IV.

By optimizing the treatment bath, the metallisation can be improved even further: by using a bath for metal deposition, which does not permit metal dissolution, a greater metal layer thickness can be achieved in total. In this case, the currents of the first and of the second electrode arrangement must be of equal size. The curve III shown in FIG. 4 coincides in this case with the abscissa since no metal is dissolved. Therefore, a thickness D of the layer is obtained which is constant over the total surface of the metal structures (curve IV').

A further simplification of the arrangement according to FIG. 3 is achieved in that the central regions with the electrodes 7', 7" (in FIG. 3) are combined so as to form one region with one electrode. In this case, two current/voltage sources are also required to supply current to the electrodes with which the different currents to both partial electrode arrangements, comprising the electrode 6' and the electrode 7', 7", on the one hand, and the electrode 7', 7" and the electrode 6", on the other hand, can be produced. The dividing wall 17 is dropped in this case. The mechanical assembly of the electrode arrangements is particularly simple in this case.

Figure 5:
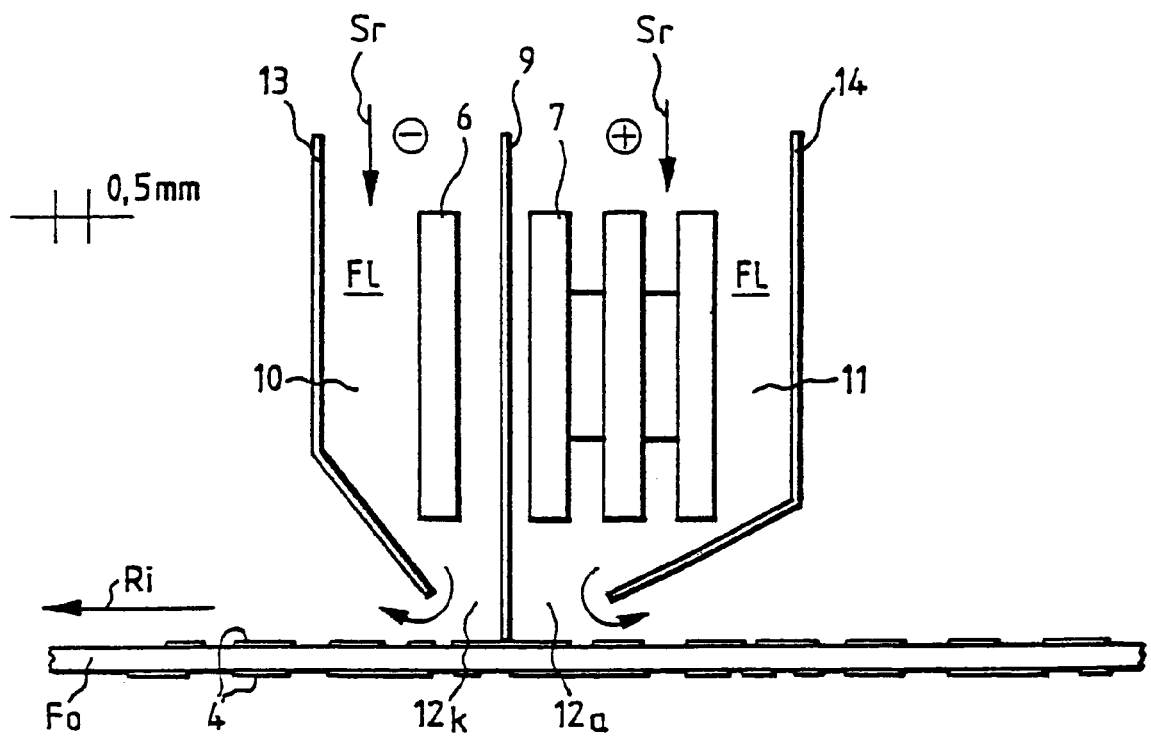
FIG. 5: a schematic illustration of two electrodes of an electrode arrangement.

The schematic assembly of the electrode arrangement in a preferred embodiment of the invention is reproduced in FIG. 5. The foil Fo with the structures 4 is illustrated underneath the electrode arrangement (the structures 4 situated on the underside of the foil Fo are electrolytically treated by a second electrode arrangement on the underside of the foil). The foil Fo is guided in the conveying direction Ri. The electrode arrangement comprises electrodes 6 (cathodic) and 7 (anodic). Between the electrodes 6 and 7 there is an insulation wall 9 which is situated in this case on the foil Fo and effects an effective, electrical screening of the field lines which emanate from the electrodes 6 and 7. The electrodes 6 and 7 are surrounded by the cathodic space 10 and the anodic space 11 in which the electrolytic fluid F1 is located. Both spaces 10 and 11 open towards the conveying plane in which the foil Fo is guided. Focusing of the effect of the electrodes on a small region of the foil Fo is achieved by two small openings $12_k$ and $12_a$ a which are formed through the lateral insulation walls 13, 14 and the insulation wall 9 between the electrodes 6 and 7. This is advantageous since, as a result, the electrolytic treatment of the small structures 4 is evened out. In contrast thereto, the electrolytic treatment of small structures, when large openings $12_a$ and $12_k$ are chosen, is irregular.

As can also be detected in FIG. 5, the electrolytic fluid F1 is fed into the electrode arrangements from above (shown by the arrows Sr). The electrochemical reaction can be speeded up because of the high flow rate.

Figure 6:
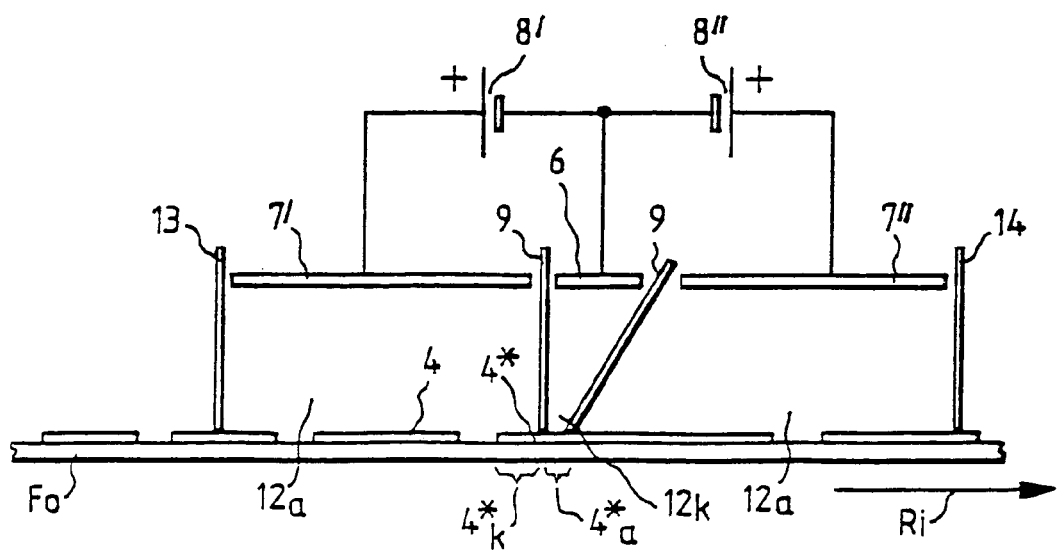
FIG. 6: a schematic illustration of a plurality of electrodes which are associated with various electrode arrangements.

In FIG. 6 there is shown a further arrangement according to the invention with a plurality of adjacent electrodes 6, 7', 7". The electrodes 6, 7', 7" are connected to the current/voltage sources 8', 8", for example galvano-rectifiers. Insulation walls 9 are located between the electrodes. A foil Fo to be treated is moved in conveying direction Ri in the conveying plane. The respective electrolytic spaces, which surround the electrodes 6, 7, have openings $12_a$, $12_k$, which are orientated towards the conveying plane and are formed by the insulation walls 9. These openings $12a$, $12_k$ are of different sizes. As a result, current densities of different size are set and hence also different potentials at the regions 4, 4* on the foil Fo which are situated opposite the openings $12_a$, $12_k$.

In the situation where a foil Fo provided with metallic regions 4 is treated in a metal deposition solution, the following situation arises.

As a result of the fact that the opening $12_k$ on the cathodically polarised electrode 6 is smaller than the opening $12_a$, on the anodically polarised electrode 7, a higher current density and hence a higher potential is set at the regions $4^*_a$ situated opposite the cathodically polarised electrode 6 than is set at the regions $4^*_k$ of the treated region 4*, which regions are situated opposite the anodically polarised electrodes 7', 7". Consequently, the competing oxygen generation will take place also, in addition to metal dissolution, during the anodic partial process in the region of the cathodically polarised electrode 6 so that less metal is removed in this region $4^*_a$ than the amount of metal deposited in the region $4^*_k$. In summary, a metal layer is thus formed.

Figure 7:
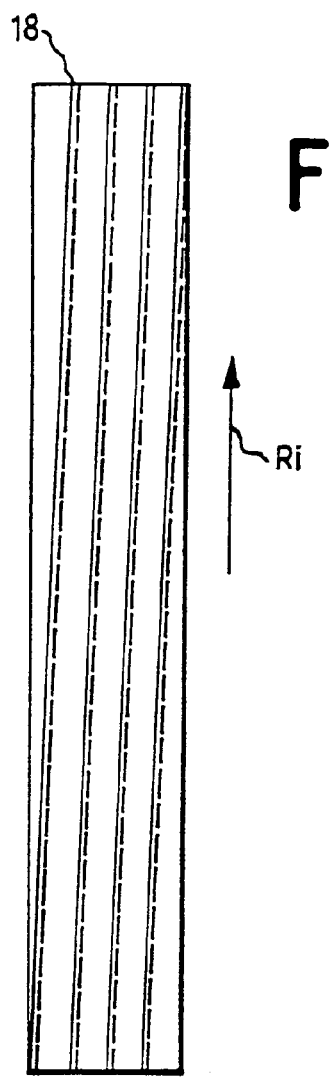
FIG. 7: a special arrangement of a plurality of electrode arrangements along a conveying route for the material in a continuous system.

In FIG. 7, a special arrangement of a plurality of electrode arrangements 18 along the conveying line for the material in a continuous system is reproduced in plan view. The electrodes 6', 6", 7', 7" in the arrangement of FIG. 1 are schematically illustrated by the continuous and broken straight lines. The electrode arrangements 18 are set slightly diagonally in the conveying direction Ri and extend at a corresponding length in the electrolytic unit. Each electrode arrangement 18 serves only for treating a part of the surface of the material to be treated. Hence, the treatment time is significantly increased. If the electrolytic unit has for example a length of 1.40 m and a width of 0.2 m, then, in the illustrated arrangement with four electrode arrangements 18, there results an increase in treatment time of 1400 mm×4/200 mm=28. In the case of an active length of an electrode arrangement 18 of 1 mm, there results hence a treatment time of approximately 17 sec, at a conveying rate of for example 0.1 m/min. With an average deposition current density at the level of 10 A/dm$^2$, the layer thickness of deposited copper is approximately 0.6 μm. If a plurality of electrodes is used to treat partial regions of the material, then the layer thickness multiplies with the number of electrodes.

Figure 8A:
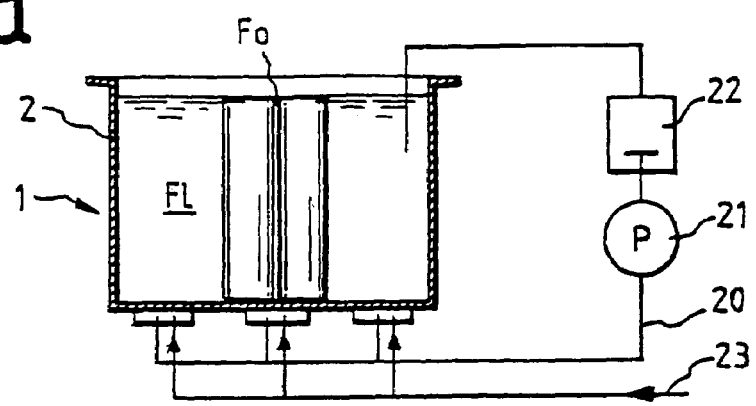
FIG. 8a: a section through a continuous system.

A continuous system 1 is illustrated in section in FIG. 8a. A foil strip Fo is transported in this case for example by cylinders and held vertically. The strip Fo is introduced into a container 2 from the side, said container containing the treatment bath, for example a metallisation solution F1. This solution is continuously withdrawn from the container 2 by means of a pump 21 via suitable pipelines 20 and guided over a filter 22 before said solution is fed back into the container. In addition, air can be introduced via a pipeline 23 in the container 2 in order to add turbulence to the solution F1.

Figure 8B:
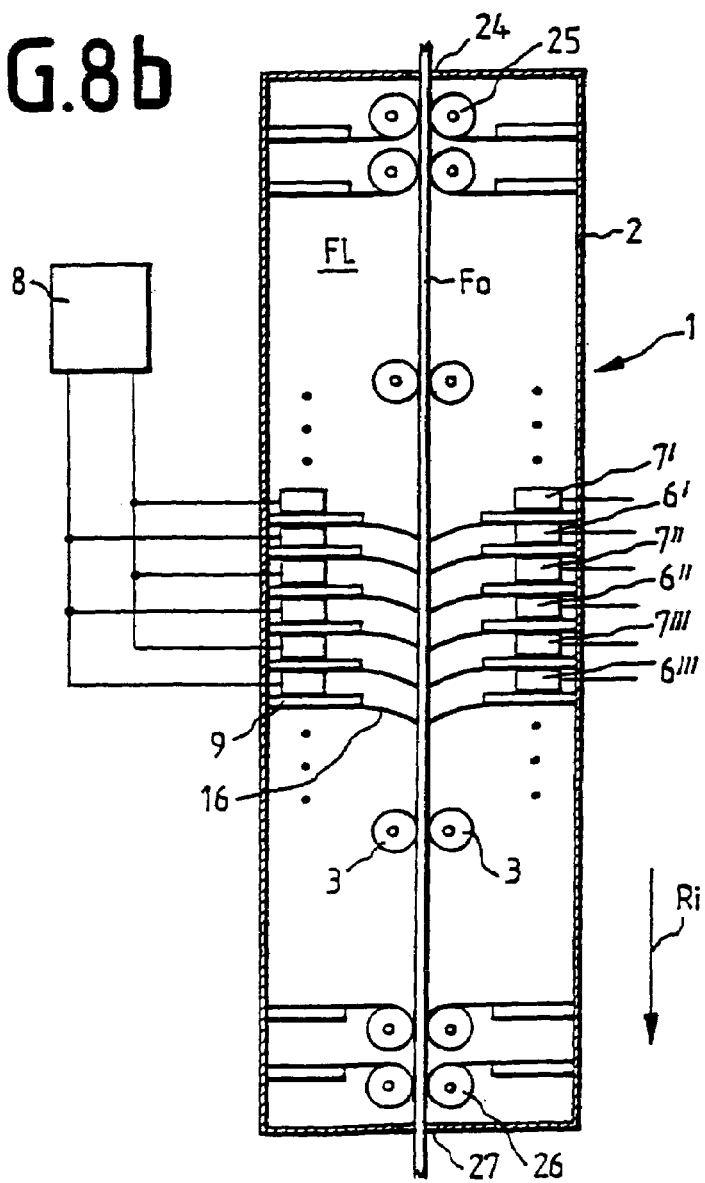
FIG. 8b: a plan view of a flow unit.

In FIG. 8b, the unit 1 shown in FIG. 8a is reproduced in a plan view, the fittings only being illustrated in part. The foil strip Fo is guided in conveying direction Ri. The treatment fluid F1 is situated internally of the container 2, in this case a solution which is suitable for electrolytic etching. The strip Fo is introduced via the opening 24 and through squeeze rollers 25 into the container 2 and between squeeze rollers 26 and through the opening 27 once again out of the container. Within the container 2, the strip Fo is guided by means of suitable guide elements 3, for example by rollers or cylinders.

In the container 2, there is a plurality of electrode arrangements, which are disposed successively and on both sides of the conveying plane for the strip Fo, said electrode arrangements being formed respectively from cathodically polarised electrodes 6', 6", 6"', . . . and anodically polarised electrodes 7', 7", 7"' . . . Insulation walls 9 are situated between the electrodes. These insulation walls 9 have elastic seal films 16 which make possible complete screening of the electrical fields of the individual electrode spaces from each other in that they contact the material surfaces when passing the strip Fo. The electrodes 6', 6", 6"', . . . , 7', 7", 7"', are connected to a galvano-rectifier 8, the connections of the electrodes shown on the right in FIG. 8b to the rectifier not being illustrated. Each electrode arrangement can also be supplied from separate rectifiers.

When the strip Fo is guided for example first past an anodically polarised electrode and then past a cathodically polarised electrode, metal is electrolytically removed.

Figure 9:
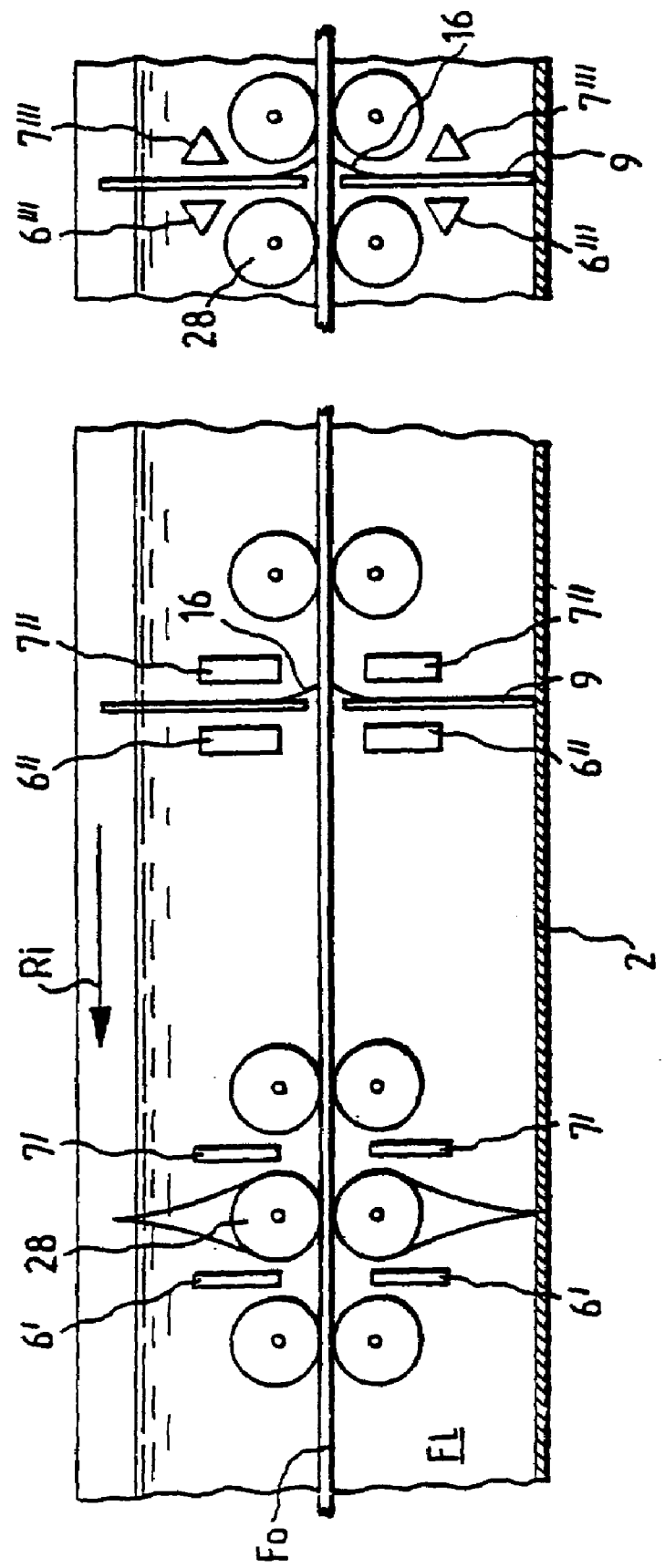
FIG. 9: a lateral section through a continuous system in which the material is transported in a horizontal conveying plane.

In FIG. 9, a horizontal unit for electrolytic treatment of foil strip Fo is illustrated in lateral section. The container 2 contains the treatment fluid F1. The foil Fo to be treated is guided horizontally in the treatment fluid F1 past the electrode arrangements in conveying direction Ri. The electrode arrangements in turn comprise respectively cathodically polarised electrodes 6', 6", 6"', . . . and anodically polarised electrodes 7', 7", 7"', . . . The electrode arrangements are disposed on both sides of the conveying plane in which the foil Fo is guided.

In the present case, insulation rollers 28 with sealing lips are used to insulate the electrodes 6', 6", 6"', . . . , 7', 7", 7"', . . . from each other. Instead of insulation rollers 28, insulation walls 9 with seal films 16 can also be used.

In the right part of FIG. 9, an alternative embodiment and arrangement of the electrodes 6"', 7"' relative to the insulation walls 9 and seal films 16 is illustrated.

Figure 10:
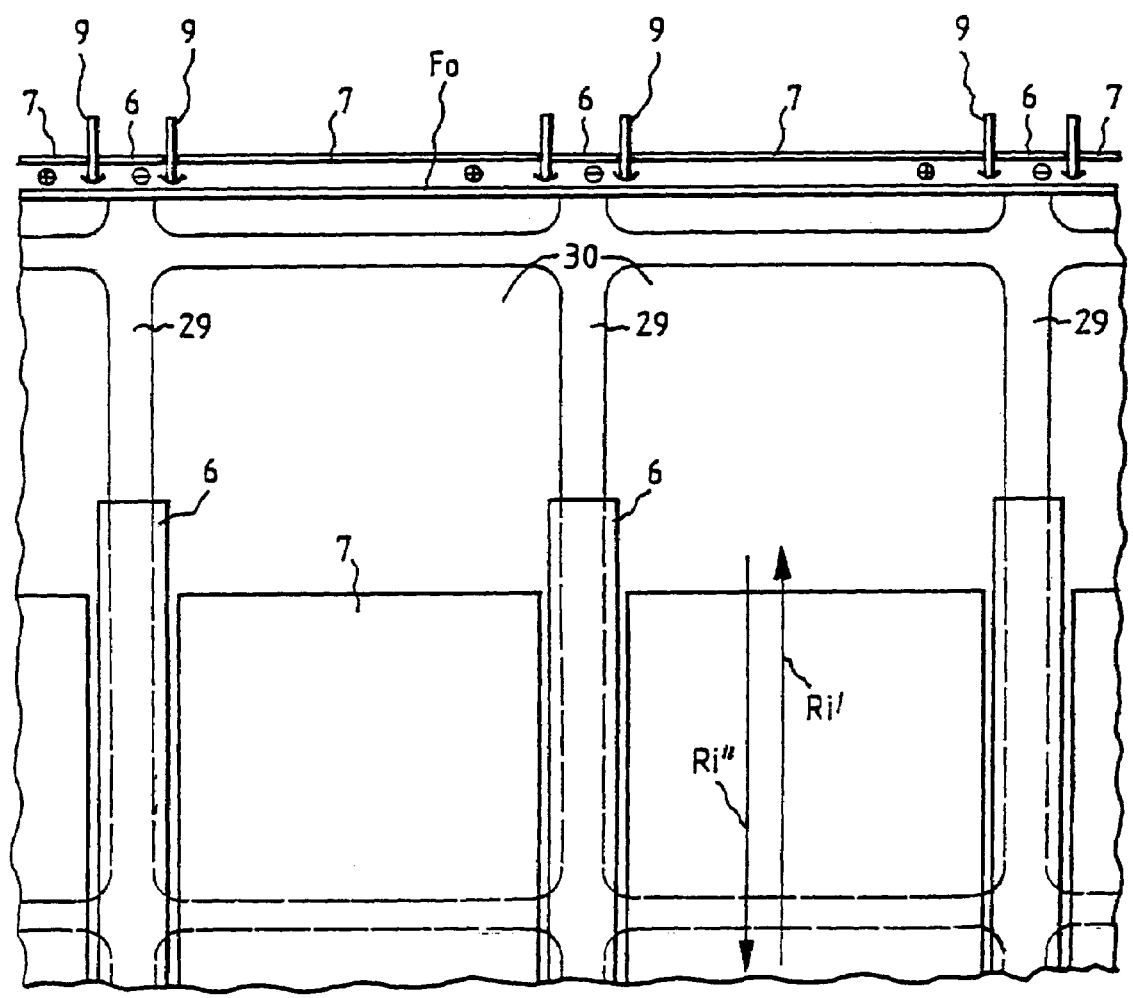
FIG. 10: a plan view of a foil with copper structures and a projection of the electrodes from a plurality of electrode arrangements.

In FIG. 10, a plan view of a foil Fo is illustrated which has metal sacrificial regions 29 and regions 30 provided with metal structures (structures not shown), which are connected to each other electrically. This foil Fo can be treated for example in a horizontal unit by being plunged into the treatment fluid and being guided past the electrode arrangements according to the invention. The electrodes 6, 7 of the electrode arrangements are illustrated here in projection on the foil Fo. The anodically polarised electrodes 7 are orientated on the structured regions 30 and designated by "⊖" and the cathodically polarised electrodes 6 are orientated on the sacrificial regions 29, which are made of metal and are designated by "θ". Insulation walls 9 are disposed between the electrodes 6 and 7. The insulation walls 9 and the electrodes 6, 7 are only indicated in the illustration of FIG. 10, this detail concerning a section representation through the plane of projection of the Figure.

The material piece is guided in one of the conveying directions Ri' and Ri". The sacrificial regions 29, which are made of metal, are continuously guided past the cathodically polarised electrodes 6 and thus are dissolved. The structured regions 30, on the other hand, are metallised since they are guided past the electrodes 7. By means of this arrangement, it is possible for a metal to be deposited which is identical to the metal from which the structured regions are made.

Figure 11:
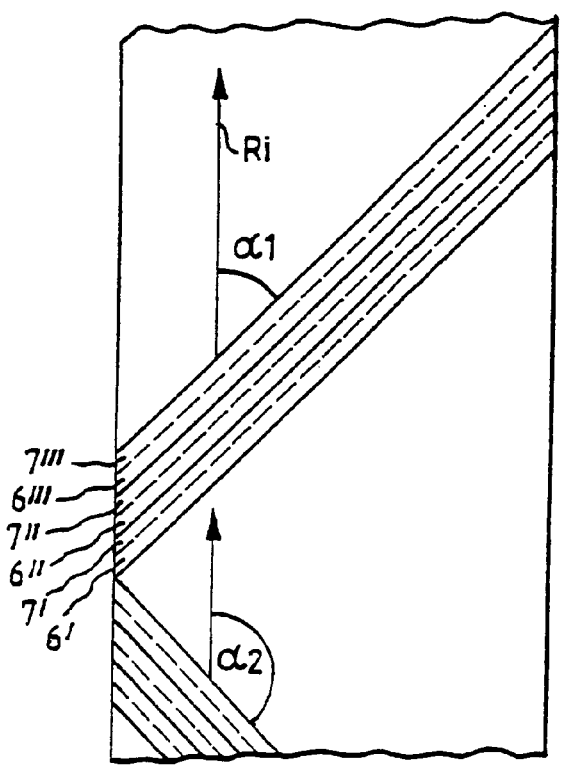
FIG. 11: a further special arrangement of a plurality of electrode arrangements along the conveying route for the material in a continuous system.

A further preferred device according to the invention is illustrated schematically in FIG. 11. The material is guided past the electrode arrangements in conveying direction Ri, said electrode arrangements comprising respectively extended electrodes 6', 6", 6"', . . . and 7', 7", 7"', . . . The electrode arrangements with the electrodes form an angle $\alpha_1$ or an angle $\alpha_2$ relative to the conveying direction Ri. As a result, the effect of the treatment time of structures which are orientated differently relative to the conveying direction Ri is compensated for. Since, in the case of conductive foils, the conductive tracks usually extend parallel or perpendicular to a lateral edge of the foils and hence parallel or perpendicular to the conveying direction Ri, a treatment time of equal length is achieved for conductive tracks of both orientations by means of the illustrated orientation of the electrode arrangements, as long as these conductive tracks of both orientations have the same length.

Figure 12:
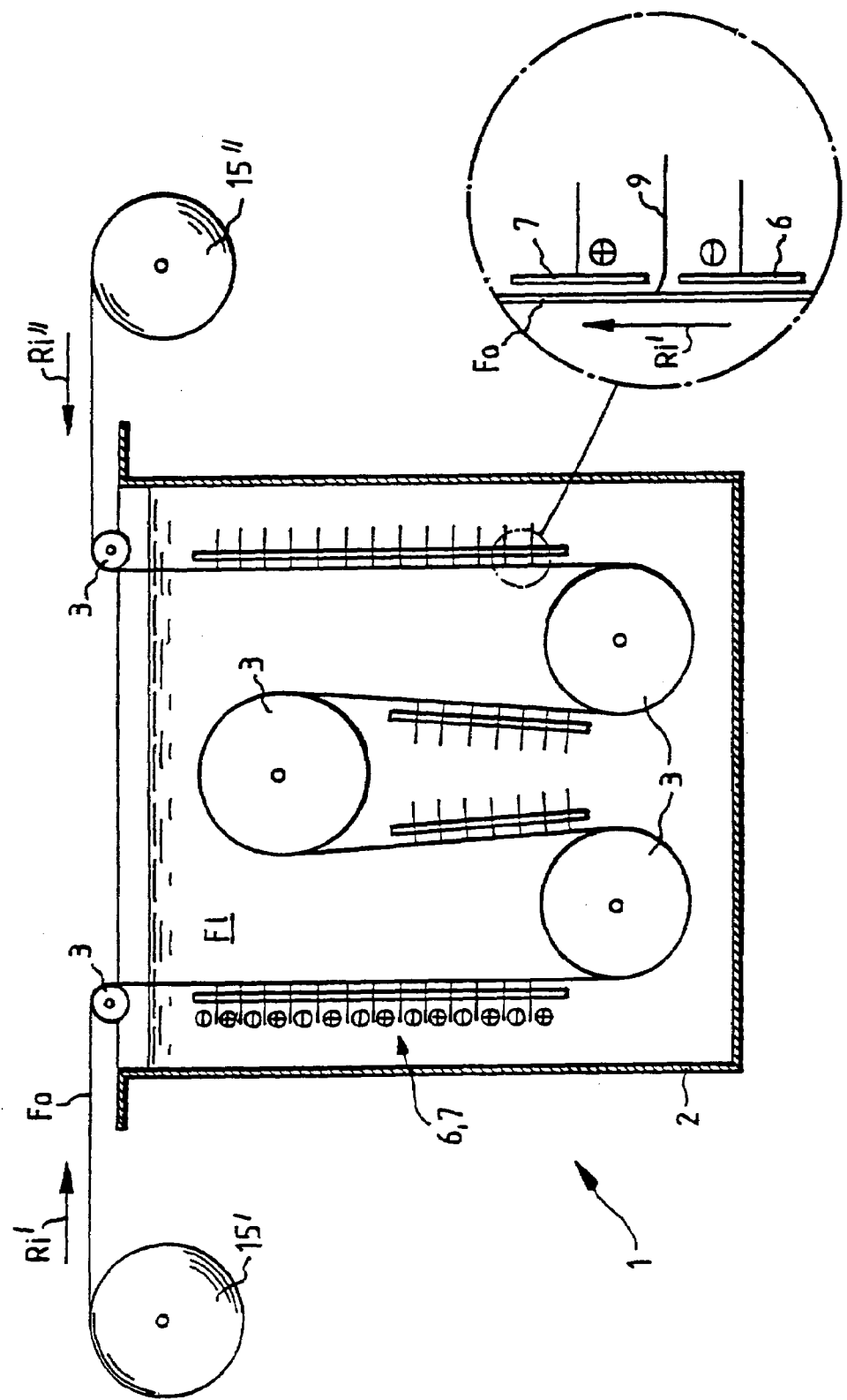
FIG. 12: a schematic illustration of a reel-to-reel unit for electrolytic treatment of foil material.

A further treatment unit 1 is schematically illustrated in FIG. 12 in which long foil strips Fo can be electrolytically treated. Units 1 of this type are designated as reel-to-reel units.

The strip Fo is unwound from a first roller 15' which serves as a store for the foil strip Fo, and wound onto a second roller 15" when the strip is transported through the unit 1 in conveying direction Ri'. When the strip Fo is transported through the unit 1 in conveying direction Ri", the roller 15" serves to unwind the strip and the roller 15' to wind up the strip Fo after rinsing and drying.

Furthermore, the treatment unit 1 comprises a container 2 in which a treatment fluid Fl is situated. The strip Fo is guided via a plurality of deflection rollers 3 after entering the container 2, said rollers 3 having no electrical function, and said strip is thereby guided past a multiplicity of electrode arrangements, which comprise respectively a cathodically polarised electrode 6 and an anodically polarised electrode 7. The cathodically polarised electrodes 6 are designated by "θ" and the anodically polarised electrodes 7 by "⊕". In the present case, the electrode arrangements are only disposed on one surface of the strip Fo. If both surfaces of the strip Fo are to be treated, there must be electrode arrangements located on both sides of the insulating strip.

A portion of an electrode arrangement with the strip Fo which is guided past said electrode arrangement is illustrated in a detail in FIG. 12. The cathodically polarised electrode 6 is separated from the anodically polarised electrode 7 by an insulation wall 9.

| | Reference symbols: |
|---|---|
| 1 | treatment unit |
| 2 | bath container |
| 3 | guide element for the foil material Fo |
| 4 | metallic structure on the foil material Fo |
| 4* | treated metallic structure 4 |
| 4*$_a$ | anodically treated metallic structure 4 |
| 4*$_k$ | cathodically treated metallic structure 4 |
| 5 | diaphragm |
| 6, 6', 6", 6'" | cathodically polarised electrodes |
| 7, 7', 7", 7'" | anodically polarised electrodes |
| 8, 8', 8" | current/voltage sources |
| 9 | insulation wall |
| 10 | cathodic space |
| 11 | anodic space |
| 12 | opening of the electrode arrangement to the bath container |
| 12$_k$ | opening to the cathodically polarised electrode |
| 12$_a$ | opening to the anodically polarised electrode |
| 13 | insulating lateral wall of the electrode arrangement |
| 14 | insulating lateral wall of the electrode arrangement |
| 15', 15" | storage rollers for winding/unwinding foil strips Fo |
| 16 | seal film |
| 17 | insulation wall between two electrode arrangements |
| 18 | electrode arrangement |
| 20 | electrolytic line |
| 21 | pump |
| 22 | filter |
| 23 | air supply |
| 24 | inlet opening |
| 25 | squeeze roller |
| 26 | squeeze roller |
| 27 | outlet opening |
| 28 | insulation roller |
| 29 | sacrificial region |

| | Reference symbols: |
|---|---|
| 30 | structured region |
| Fo | sheet/foil material piece |
| Ri, Ri', Ri" | conveying direction |
| Fl | treatment fluid |
| Sr | flow direction of the treatment fluid Fl |

What is claimed is:

1. Method for electrolytic treatment of electrically mutually insulated, electrically conductive structures (4) on surfaces of an electrically insulating foil material (Fo), comprising the steps of:

a) unloading the foil material (Fo) from a store (15', 15");

b) transporting the foil material (Fo) on a conveying line through a treatment unit (1) and thereby bringing the foil material in contact with a treatment fluid (F1);

c) during the transporting, guiding the foil material past at least one electrode arrangement, which comprises respectively at least one cathodically polarised electrode (6) and at least one anodically polarised electrode (7), the at least one cathodically polarised electrode (6) and the at least one anodically polarised electrode (7) being brought in contact with the treatment fluid (F1) and being connected to a current/voltage source (8) flowing a current through the electrodes (6,7) and the electrically conductive structures (4) so that the electrolytic treatement takes place at the surfaces of the material (Fo), furthermore the electrodes (6,7) of an electrode arrangement being disposed in such a manner that they are oriented on one side of the material (Fo), and at least one insulation wall (9) being disposed between the electrodes (6,7) wherein the guiding of the foil material past the at least one electrode arrangement does not require electrical contact of the foil material with any electrodes in order to effect the electrolytic treatment;

d) arranging the at least one cathodically polarised electrode and the at least one anodically polarised electrode in the at least one electrode arrangement to match the size of the electrically mutually insulated, electrically conductive structures, such that electric field lines emanating from the at least one cathodically polarised electrode and from the at least one anodically polarised electrode are effective to electrolytically treat a same one of the electrically mutually insulated, electrically conductive structures; and e) finally loading the foil material back onto a store (15',15").

2. Method according to claim 1, characterized in that at least the one insulation wall (9) is disposed in such a manner that it contacts the material (Fo) during transportation through the treatment unit (1) or that it at least reaches directly up to the material (Fo).

3. Method according to one of the preceding claims 1–2, characterized in that the material (Fo) is guided successively past at least two electrode arrangements.

4. Method according to one of the preceding claims 1–2, characterized in that the electrodes (6, 7) have an extended configuration and are disposed substantially parallel to a plane in which the material (Fo) is transported.

5. Method according to claim 4, characterized in that the electrodes (6, 7) extend approximately over the entire width of the material (Fo) and substantially perpendicular to the direction (Ri) in which the material (Fo) is transported.

6. Method according to claim 4, characterized in that the electrodes (6, 7) form an angle $\alpha \neq 90°$ to the direction (Ri) in which the material (Fo) is transported.

7. Method according to one of the preceding claims 1–2, characterized in that the material (Fo) is guided past at least two electrode arrangements with electrodes (6, 7) in an extended configuration, the electrodes (6, 7) of different electrode arrangements forming different angles to the direction (Ri) in which the material (Fo) is transported.

8. Method according to one of the preceding claims 1–2, further comprising the step of moving the electrodes (6,7) in an oscillating manner substantially parallel to the plane in which the material (Fo) is transported.

9. Method according to one of the preceding claims 1–2, wherein the method for electrolytic treatment is applied for depositing metal on the material (Fo) wherein the electrically mutually insulated, electrically conductive structures (4) comprise at least one metal surface, characterized in that the at least one insulation wall includes insulation walls (13,14), and in that the at least one electrode arrangement is surrounded by the insulation walls (13,14), in that openings ($12_k$, $12_a$) to the at least one electrode arrangement, which openings are oriented towards the surfaces of the material (Fo), are formed by the insulation walls (13,14) and insulation walls (9), which are disposed between the electrodes (6,7), and in that the at least one cathodically polarised electrode includes cathodically polarised electrodes (6), and in that the at least one anodically polarised electrode includes anodically polarised electrodes (7), and in that the openings ($12_k$, $12_a$), observed in a conveying direction (Ri), have respectively such a width that the openings ($12_k$), which are associated with the cathodically polarised electrodes (6), are smaller than the openings ($12_a$), which are associated with the anodically polarised electrodes (7)

10. Method according to one of the preceding claims 1–2, characterized in that a plurality of electrode arrangements, which are disposed parallel to each other and adjacent, are provided with the electrodes (6,7) arranged in an extended configuration and that the electrodes (6,7), which are adjacent to each other, are connected respectively to the current/voltage source (8).

11. Method according to claim 10, characterized in that the current density at the structures (4), which are situated opposite a first electrode arrangement, is set approximately twice as great as the current density at the structures (4), which are situated opposite a second electrode arrangement.

12. Method according to one of the preceding claims 1–2, characterized in that the at least one cathodically polarised electrode includes a plurality of cathodically polarised electrodes, and in that electrolytic spaces (10), which surround the cathodically polarised electrodes (6), are screened by ion-sensitive membranes (5).

13. Method according to one of the preceding claims 1–2, characterized in that the electrical current is modulated in such a way that a unipolar or bipolar current pulse sequence flows through the electrodes (6,7) and the surfaces of the material (Fo).

14. Method according to one of the preceding claims 1–2, wherein the method for electrolytic treatment is applied for etching at least one metal surface on the material (Fo), wherein the electrically mutually insulated, electrically conductive structures (4) comprise the at least one metal surface, characterized in that the at least one insulation wall includes insulation walls (13,14), and in that the at least one electrode arrangement is surrounded by the insulation walls (13,14), in that openings ($12_k$, $12_a$) to the at least one electrode arrangement, which openings are oriented towards the surfaces of the material (Fo), are formed by the insulation walls (13,14) and insulation walls (9), which are disposed between the electrodes (6,7), and in that the at least one cathodically polarised electrode includes cathodically polarised electrodes (6), and in that the at least one anodically polarised electrode includes anodically polarised electrodes (7), and in that the openings ($12_k$, $12_a$), observed in a conveying direction (Ri), have respectively such a width that the openings ($12_k$), which are associated with the cathodically polarised electrodes (6), are larger than the openings ($12_a$), which are associated with the anodically polarised electrodes (7).

15. The method according to claim 1, wherein the electrolytic treatment comprises depositing metal on the foil material (Fo), and wherein during said step of guiding the foil material past at least one electrode arrangement the foil material (Fo) is first guided past the at least one cathodically polarised electrode (6) and then past the at least one anodically polarised electrode (7).

16. The method of claim 15, wherein the electrically mutually insulated, electrically conductive structures (4) comprise copper surfaces and wherein the electrolytic treatment comprises depositing tin on the copper surfaces.

17. The method according to claim 1, wherein the electrically mutually insulated, electrically conductive structures (4) comprise metal surfaces, wherein the electrolytic treatment comprises etching the metal surfaces, and wherein during said step of guiding the foil material past at least one electrode arrangement the foil material (Fo) is first guided past the at least one anodically polarised electrode (7) and then past the at least one cathodically polarised electrode (6).

18. Device for electrolytic treatment of electrically mutually insulated, electrically conductive structures (4) on surfaces of electrically insulating foil material (Fo), which has the following features;
   a) at least a first and second means (15', 15") respectively for storing the foil material (Fo);
   b) transport means (3), for transporting the foil material (Fo) on a conveying line through a treatment unit (1) from at least the one first storing means (15', 15") to at least the one second storing means (15', 15") for the material (Fo);
   c) at least one means for bringing the foil material (Fo) in contact with a treatment fluid (F1) when the treatment fluid is applied to the device;
   d) at least one electrode arrangement, which comprises respectively at least one cathodically polarised electrode (6) and at least one anodically polarised electrode (7), the at least one cathodically polarised electrode (6) and the at least one anodically polarised electrode (7) adapted to make contact with the treatment fluid (F1) when the treatment fluid is applied to the device, the at least one cathodically polarised electrode (6) and the at least one anodically polarised electrode (7) of an electrode arrangement being oriented on one side of the conveying line;
   e) at least one insulation wall (9) between the electrodes (6, 7) of the at least one electrode arrangement respectively; and
   f) at least one current/voltage source (8) which is connected to the electrode arrangement in order to produce a current flow through the electrodes (6, 7) of the arrangement;
   g) the electrodes (6, 7) being mutually screened by at least the one insulation wall in such a manner that substantially no electrical current can flow directly between the oppositely polarised electrodes (6, 7); and h) wherein the transport means includes means for guiding the foil material past the electrodes to effect the electrolytic treatment of the foil material without requiring electrical contact of the foil material with any electrode, characterized in that the electrodes (6, 7) have an extended configuration and are disposed substantially parallel to a plane in which the material (Fo) is transported, characterized in that the electrodes (6, 7) form an angle $\alpha \neq 90°$ to the direction (Ri) in which the material (Fo) is transported.

19. Device for electrolytic treatment of electrically mutually insulated, electrically conductive structures (4) on surfaces of electrically insulating foil material (Fo), which has the following features;
    a) at least a first and second means (15', 15") respectively for storing the foil material (Fo);
    b) transport means (3), for transporting the foil material (Fo) on a conveying line through a treatment unit (1) from at least the one first storing means (15', 15") to at least the one second storing means (15', 15") for the material (Fo);
    c) at least one means for bringing the foil material (Fo) in contact with a treatment fluid (F1) when the treatment fluid is applied to the device;
    d) at least one electrode arrangement, which comprises respectively at least one cathodically polarised electrode (6) and at least one anodically polarised electrode (7), the at least one cathodically polarised electrode (6) and the at least one anodically polarised electrode (7) adapted to make contact with the treatment fluid (F1) when the treatment fluid is applied to the device, the at least one cathodically polarised electrode (6) and the at least one anodically polarised electrode (7) of an electrode arrangement being oriented on one side of the conveying line;
    e) at least one insulation wall (9) between the electrodes (6, 7) of the at least one electrode arrangement respectively; and
    f) at least one current/voltage source (8) which is connected to the electrode arrangement in order to produce a current flow through the electrodes (6, 7) of the arrangement;
    g) the electrodes (6, 7) being mutually screened by at least the one insulation wall in such a manner that substantially no electrical current can flow directly between the oppositely polarised electrodes (6, 7); and
    h) wherein the transport means includes means for guiding the foil material past the electrodes to effect the electrolytic treatment of the foil material without requiring electrical contact of the foil material with any electrode, characterized in that there are provided at least two electrode arrangements with electrodes (6, 7) in an extended configuration, the electrodes (6, 7) of different electrode arrangements forming different angles to the direction (Ri) in which the material (Fo) is transported.

20. Device for electrolytic treatment of electrically mutually insulated, electrically conductive structures (4) on surfaces of electrically insulating foil material (Fo), which has the following features;
    a) at least a first and second means (15', 15") respectively for storing the foil material (Fo);
    b) transport means (3), for transporting the foil material (Fo) on a conveying line through a treatment unit (1) from at least the one first storing means (15', 15") to at least the one second storing means (15', 15") for the material (Fo);
    c) at least one means for bringing the foil material (Fo) in contact with a treatment fluid (F1) when the treatment fluid is applied to the device;
    d) at least one electrode arrangement, which comprises respectively at least one cathodically polarised electrode (6) and at least one anodically polarised electrode (7), the at least one cathodically polarised electrode (6) and the at least one anodically polarised electrode (7) adapted to make contact with the treatment fluid (F1) when the treatment fluid is applied to the device, the at least one cathodically polarised electrode (6) and the at least one anodically polarised electrode (7) of an electrode arrangement being oriented on one side of the conveying line;
    e) at least one insulation wall (9) between the electrodes (6, 7) of the at least one electrode arrangement respectively; and
    f) at least one current/voltage source (8) which is connected to the electrode arrangement in order to produce a current flow through the electrodes (6, 7) of the arrangement;
    g) the electrodes (6, 7) being mutually screened by at least the one insulation wall in such a manner that substantially no electrical current can flow directly between the oppositely polarised electrodes (6, 7); and
    h) wherein the transport means includes means for guiding the foil material past the electrodes to effect the electrolytic treatment of the foil material without requiring electrical contact of the foil material with any electrode, characterized in that at least the one insulation wall (9) is disposed in such a manner that it contacts the material (Fo) during transportation through the treatment unit (1) or that it at least reaches directly up to the material (Fo), characterized in that the electrodes (6, 7) have an extended configuration and are disposed substantially parallel to a plane in which the material (Fo) is transported, characterized in that the electrodes (6, 7) form an angle $\alpha \neq 90°$ to the direction (Ri) in which the material (Fo) is transported.

21. Device for electrolytic treatment of electrically mutually insulated, electrically conductive structures (4) on surfaces of electrically insulating foil material (Fo), which has the following features;
    a) at least a first and second means (15', 15") respectively for storing the foil material (Fo);
    b) transport means (3), for transporting the foil material (Fo) on a conveying line through a treatment unit (1) from at least the one first storing means (1 5', 15") to at least the one second storing means (15', 15") for the material (Fo);
    c) at least one means for bringing the foil material (Fo) in contact with a treatment fluid (F1) when the treatment fluid is applied to the device;
    d) at least one electrode arrangement, which comprises respectively at least one cathodically polarised electrode (6) and at least one anodically polarised electrode (7), the at least one cathodically polarised electrode (6) and the at least one anodically polarised electrode (7) adapted to make contact with the treatment fluid (F1) when the treatment fluid is applied to the device, the at least one cathodically polarised electrode (6) and the at least one anodically polarised electrode (7) of an electrode arrangement being oriented on one side of the conveying line;
    e) at least one insulation wall (9) between the electrodes (6, 7) of the at least one electrode arrangement respectively; and f) at least one current/voltage source (8) which is connected to the electrode arrangement in order to produce a current flow through the electrodes (6, 7) of the arrangement;

g) the electrodes (6, 7) being mutually screened by at least the one insulation wall in such a manner that substantially no electrical current can flow directly between the oppositely polarised electrodes (6, 7); and h) wherein the transport means includes means for guiding the foil material past the electrodes to effect the electrolytic treatment of the foil material without requiring electrical contact of the foil material with any electrode, characterized in that at least the one insulation wall (9) is disposed in such a manner that it contacts the material (Fo) during transportation through the treatment unit (1) or that it at least reaches directly up to the material (Fo), and characterized in that there are provided at least two electrode arrangements with electrodes (6, 7) in an extended configuration, the electrodes (6, 7) of different electrode arrangements forming different angles to the direction (Ri) in which the material (Fo) is transported.

22. Device for electrolytic treatment of electrically mutually insulated, electrically conductive structures (4) on surfaces of electrically insulating foil material (Fo), which has the following features;

a) at least a first and second means (15', 15") respectively for storing the foil material (Fo);

b) transport means (3), for transporting the foil material (Fo) on a conveying line through a treatment unit (1) from at least the one first storing means (15', 15") to at least the one second storing means (15', 15") for the material (Fo);

c) at least one means for bringing the foil material (Fo) in contact with a treatment fluid (F1) when the treatment fluid is applied to the device;

d) at least one electrode arrangement, which comprises respectively at least one cathodically polarised electrode (6) and at least one anodically polarised electrode (7), the at least one cathodically polarised electrode (6) and the at least one anodically polarised electrode (7) adapted to make contact with the treatment fluid (F1) when the treatment fluid is applied to the device, the at least one cathodically polarised electrode (6) and the at least one anodically polarised electrode (7) of an electrode arrangement being oriented on one side of the conveying line, the at least one cathodically polarised electrode and the at least one anodically polarised electrode being arranged in the at least one electrode arrangement to match the size of the electrically mutually insulated, electrically conductive structures, such that electric field lines emanating from the at least one cathodically polarised electrode and from the at least one anodically polarised electrode are effective to electrolytically treat a same one of the electrically mutually insulated, electrically conductive structures;

e) at least one insulation wall (9) between the electrodes (6, 7) of the at least one electrode arrangement respectively;

f) at least one current/voltage source (8) which is connected to the electrode arrangement in order to produce a current flow through the electrodes (6, 7) of the arrangement;

g) the electrodes (6, 7) being mutually screened by at least the one insulation wall in such a manner that substantially no electrical current can flow directly between the oppositely polarised electrodes (6, 7); and h) wherein the transport means includes means for guiding the foil material past the electrodes to effect the electrolytic treatment of the foil material without requiring electrical contact of the foil material with any electrode.

* * * * *